United States Patent [19]

Löschner et al.

[11] Patent Number: 4,835,392

[45] Date of Patent: May 30, 1989

[54] ION-PROJECTION APPARATUS

[75] Inventors: Hans Löschner, Wien; Gerhard Stengl, Wernberg, both of Austria

[73] Assignee: IMS Ionen Mikrofabrikations Systeme Gesellschaft m.b.H., Austria

[21] Appl. No.: 123,128

[22] Filed: Nov. 20, 1987

[30] Foreign Application Priority Data

Nov. 27, 1986 [AT] Austria ................................. 3173/86

[51] Int. Cl.⁴ .......................................... H01J 37/302
[52] U.S. Cl. .................................. 250/492.2; 250/398
[58] Field of Search ................. 250/492.21, 492.2, 398

[56] References Cited

U.S. PATENT DOCUMENTS

| 3,845,312 | 10/1974 | Allison | 250/492.21 |
| 4,158,141 | 6/1979 | Seliger et al. | 250/492.21 |
| 4,370,556 | 1/1983 | Stengl et al. | 250/503.1 |
| 4,385,238 | 5/1983 | Westerberg et al. | 250/491.1 |
| 4,514,638 | 8/1985 | Lischke et al. | 250/492.2 |
| 4,757,208 | 7/1988 | McKenna et al. | 250/492.21 |

FOREIGN PATENT DOCUMENTS 3035200 3/1982 Fed. Rep. of Germany .
2556501 12/1983 France .

OTHER PUBLICATIONS

Julius J. Muray, Article "Physics of Ion Beam Wafer Processing", Semiconductor International, Apr. 1984, pp. 130–135, p. 129 (introduction).

Primary Examiner—Jack I. Berman

[57] ABSTRACT

An ion-projecting apparatus which has between the ion source and the mask, directly proximal to the mask, at least one ion optical correction element in the form of a multipole with at least eight poles and so located that there is no other deflection means between the octapole and the mask.

14 Claims, 3 Drawing Sheets

ION-PROJECTION APPARATUS

FIELD OF THE INVENTION

Our present invention relates to an ion-projection apparatus for generating on a substrate, e.g. a semiconductor wafer, the structure of a mask provided with physical openings, i.e. a so-called open-stencil mask, utilizing an ion beam and a shadow-projection technique whereby the structure of the mask is transferred.

BACKGROUND OF THE INVENTION

In ion-beam projection techniques for the production of semiconductors and semiconductive circuitry, it is known to provide an ion-beam projector which directs an ion beam along a beam axis onto the substrate wafer by providing along the path of this ion beam between the source and the substrate, an open-stencil mask whose openings define the structure which is transferred to the wafer. This technique, which is also referred to as shadow projection, locally blocks the beam in regions in which there are no openings in the mask. In a shadow projection, the image bears close to a 1:1 dimensional ratio with respect to the structure of the mask. Open-stencil masks, because of the techniques used in their manufacture, are frequently characterized by distortions in terms of positional shifts of the mask openings with respect to the desired positions thereof. These distortions are particularly disadvantageous when, as is common in the production of semiconductor circuits, a number of projections or imagings with different masks on the same substrate surface are required or desired.

In that case, the different masks may have different distortion states which can lead to intolerable shifts and contour inaccuracies in the imaged structures.

It is, therefore, desirable and even necessary in most cases to compensate for the distortions of each mask so that intolerable errors in the imaged structure do not arise.

The so-called "mix-and-match" process has been found to be particularly advantageous from an economic point of view. In this case the structuring of each semiconductor element is effected on two or more different apparatuses. For example, a coarse structuring can be effected by a low-cost optical wafer-stepper apparatus while the finer structuring is effected in an ion-projection apparatus.

In this case, the position of the image of the mask projected by the ion-beam projector on the wafer must be adjusted with great precision to the structures on the wafer already generated by the optical wafer-stepper apparatus.

Thus in both cases, i.e. in the case of distortion created by the ion-projection mask and in the case of the need for precise alignment of a subsequent ion-projection image with an earlier-form wafer-stepper image, a means for compensating the configuration and positions of the structures projected on the wafer is required.

There has already been described a process (H. Bohlen et al, Solid State Technology, September 1984, page 210) in which a narrow electron beam (diameter of about 1 mm) is displaced by a time-varying electrostatic deflection field in a raster pattern across the imaging mask in a so-called "scanning" process, whereby distortions which might be generated by the mask can be compensated by corresponding local changes in the deflection angle. This method has been found to be suitable only for scanning projection processes, since, at every point, the entire pencil of radiation is homogeneously deflected by the electrostatic field.

OBJECTS OF THE INVENTION

It is the principal object of the present invention to provide an improved ion-projection apparatus, especially for the production of semiconductors, which can compensate for mask-produced distortion as well as offsets of successive images whereby the drawbacks of earlier techniques are avoided.

Another object of this invention is to provide an improved apparatus for the purposes described which allows local adjustment for distortion without requiring a scanning technique in ion-projection imaging of the structure of an open-stencil mask on a substrate.

SUMMARY OF THE INVENTION

These objects and others which will become apparent hereinafter are attained, in accordance with the present invention in an ion-projection apparatus for the shadow projection of a structure of a mask upon a substrate which comprises an ion-beam source generating an ion beam capable of structuring a substrate in accordance with the structure of an open-stencil mask, a mask provided with physical openings to constitute the open-stencil mask and means for positioning that mask in the path of the beam, and an electrostatic multipole having at least eight poles surrounding an axis of the beam and positioned between the source and the mask and directly ahead of the mask in the path of the beam such that no other beam deflector is interposed between the multipole and the mask, for generating an electrostatic deflection field to locally deflect portions of the beam and compensate for distortion of the beam by the mask as to the structure transferred to the substrate by the beam.

Between the source and the mask, the beam assumes the divergent pattern surrounding the axis of the beam and by providing ahead of the mask the electrostatic multipole with at least eight and preferably even a larger number of poles, we can activate the multipole by applying different voltages at each pole and thereby effect a nonhomogeneous local deflection of parts of the beam so that the partial rays or pencils of the ion radiation transiting the mask openings can be deflected at different angles and can impinge at different angles on the wafer. The shadow image thus generated can be locally compensated for mask-induced distortions or can be adjusted in position to match the prior structuring of the image. By a dipole energization of the multipole, i.e. diametrically opposite polarities across the axis, we are able to effect in addition a homogeneous deflection of all partial rays or pencils of radiation.

Up to now, for shadow projections the mask/wafer distance had to have values in a range of less than 0.1 mm (R. Speidel, U. Beringer, Optik 54, P. 439, 1979) in order to allow submicrometer structures to be imaged. However, with the invention, because the multipole is used to shape the ion beam transiting the mask, larger distances can be used while maintaining the quality of the imaging process. Normally with higher distances, a reduction in the resolution is observed for a given characteristic of the ion beam source and a uniform distance of the ion source from the mask in accordance with the relationship $A = (D \cdot h)/s$, where A is the elongation of the smallest structure which can be generated, D the diameter of the ion beam source, s the spacing of the ion beam source from the mask and h the mask/wafer distance.

According to a further feature of the invention, the substrate should be located 5 mm or more from the mask with a range up to about 10 mm being permissible.

To maintain the requisite resolution, the diameter of the source can be reduced in accordance with the above equation and/or the mask/source distance can be increased. Due to the large distance of the wafer from the mask, a relatively large positional change of the image can be effected with reduced deflection of the beam. Reduced beam deflection is desirable to minimize the adverse effects (distortions) which might be caused by the fringe fields of the multipole.

It has been found to be advantageous, moreover, to enable the apparatus to rotate the structure as well and this can be accomplished, in accordance with the invention, by providing means for generating an axial magnetic field, i.e. a coil coaxial with the optical axis and capable of rotating the image so that, for example, the ion lithographic image can be accurately superimposed upon an image produced by a wafer stepper or the like.

In the gap between the mask and the substrate, i.e. the so-called proximity gap, we can provide a shutter, especially a mechanical shutter which allows the ion beam to continue to be generated by the source while the wafer is being positioned. This has the advantage that the temperature of the mask is maintained constant because the ion beam impinging upon it is not turned off and on repeatedly. The positional accuracy of the mask openings which would be affected by temperature changes is thus maintained within desirable tolerance levels.

According to a further feature of the invention, in the space between the mask and the substrate, i.e. in the proximity gap, at least one electronic detector can be provided to detect the position of the substrate or the position of the structure on the substrate for controlling the partial rays which transit the mask via the multipole until the ion-projection image is accurately aligned or brought into registry with the desired position on the substrate.

In this manner the newly applied image can be brought into exact registry with existing structure on the substrate. By changing the mask/wafer distance, we can change the imaging ratio, i.e. the ratio of the mask opening dimensions to the dimensions of the imaged structure. This ratio may also be referred to herein as the reproduction ratio.

BRIEF DESCRIPTION OF THE DRAWING

The above and other objects, features and advantages of the present invention will become more readily apparent from the following description, reference being made to the accompanying drawing in which.

Specific Description

Figure 1:
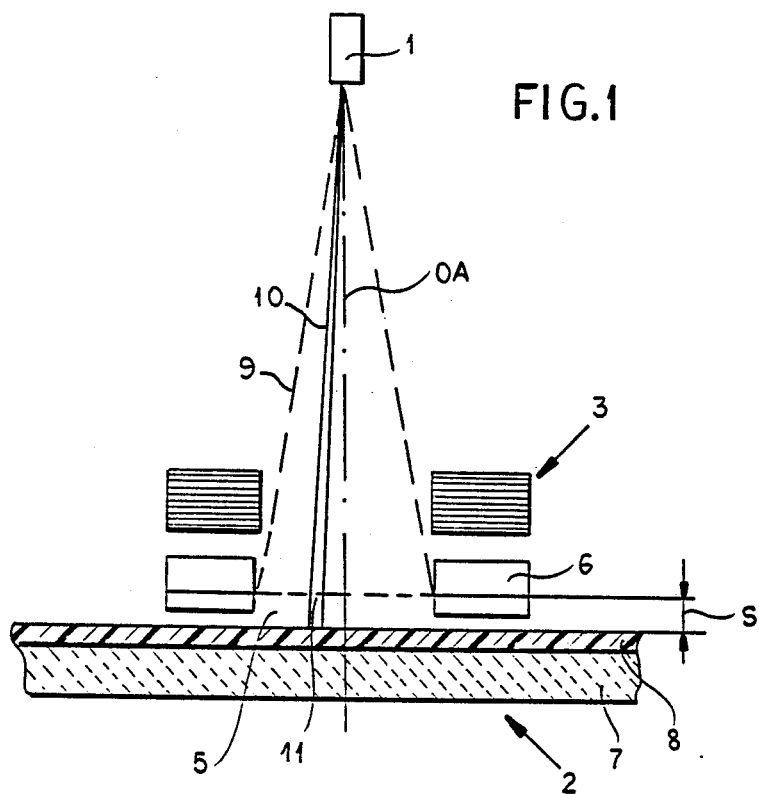
FIG. 1 is a diagrammatic section through an ion-projection apparatus in accordance with the invention.

FIG. 1 shows an ion-beam source 1 having an optical axis OA along which a divergent ion beam 9 is directed. This source can be a duoplasmatron ion source.

Beneath this ion source 1 and along the divergent ion beam 9, at a distance of about 500 mm from the source, an open structure mask 4 can be provided. The mask 4 has openings 11 and is mounted in a holder 6.

At a distance s from the mask 4 is the substrate or wafer 2 which can be provided on a table 20 described in connection with FIG. 5.

The wafer 2 can comprise a three-layer resist coating 8 which can also be referred to as a photolacquer.

With respect to the exposure of the wafer, reference may be had to the commonly-owned copending applications Ser. Nos. 06/930,807 and 06/930,812, now U.S. Pat. No. 4,780,382, both filed Nov. 13, 1986.

The photolacquer layer 8 is applied to the silicon wafer 7.

The photoresist layer 8 can comprise an AZ photolacquer layer of a thickness of 1 micrometer as the base layer, a 30 nm thickness vapor deposited germanium layer as an intermediate layer and a thin photoresist layer as an upper layer.

After shadow projection exposure with ions from the source 1, the upper resist layer is developed, the germanium structure which is then exposed can be removed locally by reactive ion etching techniques and the underlying photoresist can then be exposed and developed and the ion-beam lithography practiced on the silicon wafer through the resulting resist structure.

In a special experiment, the uppermost layer was omitted and the exposure effected directly through the germanium layer with 5 keV He+ ions. After exposure to this ion beam, the irradiated region was negatively developed in a carbon tetrafluoride plasma.

The germanium material remaining after such development masked the underlying photolacquer with respect to an oxygen plasma.

It was possible at a spacing s of 5 mm between the mask 4 and the substrate 2 over an area of 20×20 mm$^2$ to transfer the smallest structures of a test mask at 500 lines per mm.

The high resolution in part derives from the use of a duoplasmatron ion source which has a comparatively small diameter (less than 50 micrometers) (as described by G. Stengl et al, Journal of Vacuum Science & Technology B Vol. 4, page 195, 1986). With such sources, currents in excess of 100 microamperes with current densities of 100 milliamperes per sr could be used. Under these conditions, it is possible with a distance of 500 mm between the ion source and the mask to maintain the ion current density at the order of 10 microamperes/cm$^2$. For the exposure of conventional organic resist layers, for example AZ 1350 or PMMA, an ion dosage of about $10^{13}$ ions per cm$^2$ is required. This dosage can be transferred in exposure times of about 0.1 second. With ion energies of about 100 keV, structures in resist layers of about one micrometer in thickness can be transferred.

Directly above the mask 4 and its holder 6, we provide an electrostatic multipole having at least 8 electrostatic poles, e.g. the octupole 3.

The term "directly" as used here, is not intended to represent a limitation upon the distance of the multipole from the mask but only to emphasize that there is no other deflection source located between the multipole and the mask and capable of deflecting the ion beam.

Thus a distance of 10 cm, for example can be considered "directly" juxtaposing the multipole with the mask in the above sense. A diaphragm can also be located between the multipole and the mask as has been illustrated at 21 in FIG. 5.

The multipole can include (see FIG. 5) a coil 22 for generating an axial magnetic field capable of rotating the ion beam around its optical axis. The axial magnetic field coil 22 can be provided in or on the octupole, i.e. is integrated therewith.

Figure 5:
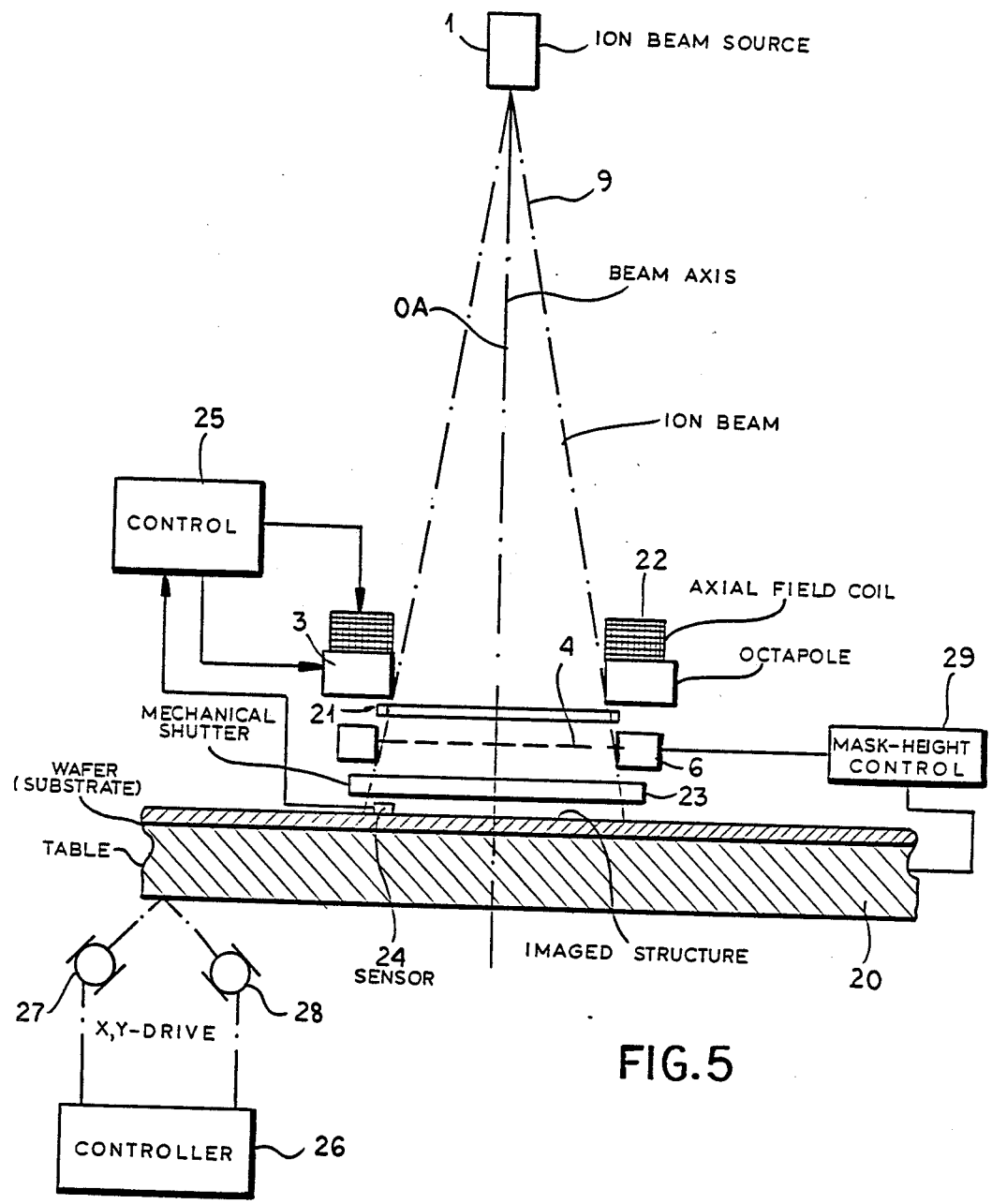
FIG. 5 is a view similar to FIG. 1 illustrating another embodiment.

As is also apparent from FIG. 5, a mechanical shutter 23 can be located in the relatively large space between the mask and the upper surface of the substrate 2. The mechanical shutter allows the ion source to be a continuously emitting source so that the ion beam is intercepted by the mask 4 even when the shutter prevents exposure of the substrate. Consequently, the temperature of the mask can be held constant and the positions of the openings of the mask can be fixed without concern for fluctuations induced by temperature variations.

As is also indicated in FIG. 5, a sensor 24 can be provided in the space between the mask and the wafer to detect the position of a structure previously imaged on the wafer to operate through a controller 24, the axial field coil 22 and the octupole 3 to ensure positionally accurate imaging of the mask on any prior image on the substrate. This is particular advantageous when the ion-projection lithographic apparatus of FIG. 1 or FIG. 5 is an ion-stepper apparatus which can be used in conjunction with an optical wafer stepper providing the first image or structure or with electron or x-ray steppers.

The stepping of the table in FIG. 5 can be effected through a further controller 26 operating motors 27 and 28 for a coordinate system stepping of the wafer in a grid pattern.

Such wafers Which have already been provided with optical (or also electron-beam or x-ray) images in respective steppers can thus receive a second image in the ion-projection lithographic apparatus of the invention with a corresponding alignment of the new image with the previous structure.

The device allows positioning of the X and Y directions as well as rotation and control of the reproduction ratio via the masks height controller 29 as shown in FIG. 5.

Figure 2:
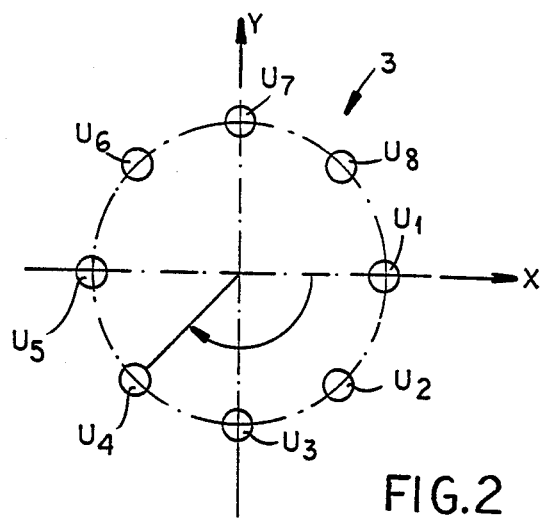
FIG. 2 is a diagram of the relationship between the multipole, in this case an octupole, and the beam axis.

FIG. 2 shows schematically the use of an octupole with electrostatic potentials $U_1 \ldots U_8$ on the eight poles.

For the development of a dipole field, the relationship of voltages applies:

$$U_1 = U_o, U_2 = U_o/\sqrt{2}, U_3 = 0,$$

$$U_4 = -U_o\sqrt{2}, U_5 = -U_o, U_6 = -U_o\sqrt{2}, U_7 = 0,$$

$$U_8 = U_o\sqrt{2} \ (U_i = U_o \cdot \cos(-\phi),$$

in which $U_o$ will depend upon the ion-beam energy, the desired shift in the X direction and the mask/wafer distance s.

For an additional shift in the Y direction, components of potential $U_i' = U_o' \cdot \sin \phi_i$ must be supplied to the potential points $U_1 \ldots U_8$.

The invention, of course, also permits individual voltage components to be applied to the poles to compensate for distortions and provide the requisite corrections. If one applies to the octupole 3, for example, all potentials $U_i = U_o \cdot |\sin \phi_i|$, different reproduction ratios in the X and Y directions can be obtained in the X and Y directions, i.e. a linear distortion or distortion correction in the y direction. For correction of nonlinear distortions, a greater number of poles, for example 64, can be provided in the multipole to allow a more precise control over the field distribution and hence the correction in the plane of the multipole.

Figure 3:
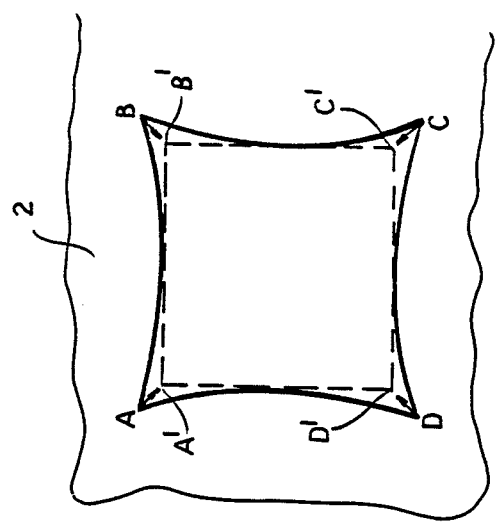
FIG. 3 is a diagram of the changes which can be induced in the projected image of a mask in accordance with the invention as seen in plan view.

In FIG. 3 we have shown the image (heavy lines) formed through a square window of a mask, the window having corners A', B', C', D'.

The image, without corrections, has curved sides AB, BC, CD and DA. By a corresponding energization of the multipole, the corner points A, B, C and D can be moved inwardly as represented by the arrows to coincide with the points A', B', C' and D', respectively and change the curved line image into a straight line reproduction.

Figure 4:
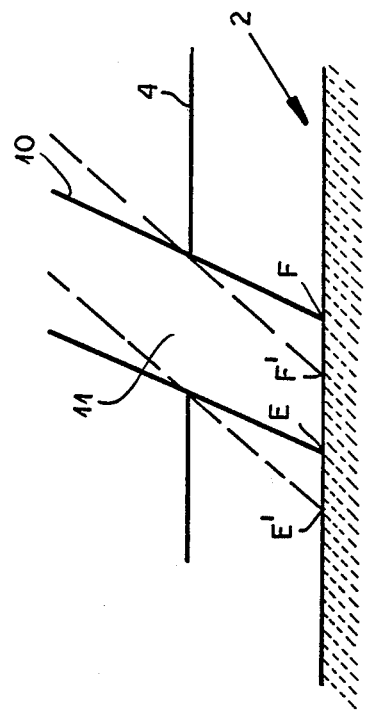
FIG. 4 is a vertical section diagramming the change in angle of the ion beam.

The shift, as can be seen in FIG. 4, is a shift in the angle with a pencil 11 of the ion beam through an opening of the mask 4, so that the boundaries 10 of the pencil will be moved from the points E and F to the points E' and F', respectively, in a leftward shift in the case shown in FIG. 4.

We claim:

1. An ion-projection apparatus for shadow projection of an image of a structure of a mask upon a substrate, that can controllably vary the image of the structure upon the substrate relative to the actual structure of the mask, comprising:
   an ion-beam source for generating an ion beam capable of projection of an image of a structure on a substrate in accordance with a structure of a mask;
   a mask in the form of an open-stencil mask with physical openings forming a structure to be transferred to a substrate and disposed in the path of said beam;
   means for supporting a substrate in the form of a wafer in a position in the path of said beam and on the opposite side of said mask from said ion-beam source, said position being spaced from said mask;
   an electrostatic multipole having at least eight poles surrounding an axis of said beam and positioned between said source and said mask and directly ahead of said mask in the path of said beam such that no other beam deflector is interposed therebetween;
   and a controller for said multipole for causing said multipole to controllably generate a nonhomogeneous electrostatic deflection field distribution that causes different ray portions of said beam prior to arriving at said mask openings to be deflected differently relative to said mask, thereby enabling controlled adjustment in the geometry of the image of the mask structure projected upon the substrate.

2. The ion-projection apparatus defined in claim 1 wherein said position of said substrate is disposed at a relatively large distance of the order of 0.5 to 10 mm from said mask.

3. The ion-projection apparatus defined in claim 2 wherein said distance is about 5 mm.

4. The ion-projection apparatus defined in claim 1, further comprising means for applying an axial magnetic field to said beam preceding said mask.

5. The ion-projection apparatus defined in claim 1 wherein said multipole is an octupole.

6. The ion-projection apparatus defined in claim 1, further comprising a shutter positioned along said axis and located between said mask and said substrate.

7. The ion-projection apparatus defined in claim 6 wherein said shutter is a mechanical shutter.

8. The ion-projection apparatus defined in claim 1 further comprising at least one electronic detector between said substrate and said mask for sensing the position of said substrate relative to said mask.

9. The ion-projection apparatus defined in claim 1 further comprising at least one electronic detector between said substrate and said mask for sensing the position of a pre-existing structure on said substrate, said controller being responsive to said detector to control said field to cause the projected image of said mask structure to match with said pre-existing structure on said substrate.

10. A method for compensating distortions of an image produced by shadow projection of a structure of a mask by an ion beam on a substrate, employing an ion-projection apparatus which comprises:

an ion beam source for generating an ion beam capable of projection of an image upon said substrate in accordance with a structure of a mask;

said mask being an open-stencil mask with physical openings forming a structure to be transferred to said substrate and disposed in the path of said beam;

means for supporting said substrate in the form of a wafer in a position in the path of said beam and on an opposite side of said mask from said ion-beam source;

said position being spaced from said mask; and an electrostatic multipole having at least eight poles surrounding an axis of said beam and positioned between said source and said mask and directly ahead of said mask in the path of said beam such that no other beam deflector is interposed therebetween, said method comprising controlling said multipole to generate an inhomogeneous electrostatic deflection field in such a manner that different ray portions of said beam become deflected at different angles to cause the image of the mask structure projected upon said substrate to conform to a desired geometry different from the actual geometry of the structure on the mask.

11. The method of claim 10 in which said method is employed to compensate distortions of said image produced by said mask.

12. The method of claim 10 in which said method is employed to alter said image to bring it into conformity with a pre-existing structure already present on said substrate.

13. The method of claim 12 wherein said apparatus further includes an alignment system including a sensor provided between said mask and said substrate and a controller and said method includes detecting the position of a pre-existing structure on said substrate with said sensor and controllably generating said electrostatic field with said controller in response to said sensor.

14. The method of claim 12 further comprising controllably operating said multipole to simultaneously compensate for distortion of said image of said structure and conform the image of said structure with a desired position on said substrate.

* * * * *

UNITED STATES PATENT AND TRADEMARK OFFICE
CERTIFICATE OF CORRECTION

PATENT NO. : 4,835,392

DATED : May 30, 1989

INVENTOR(S) : Hans Loschner et al.

It is certified that error appears in the above-identified patent and that said Letters Patent is hereby corrected as shown below:

On the title page:

Under Other Publications, --Patent Abstracts of Japan: August 6, 1982, P. 33E123; June 22, 1984, P. 158E252; February 14, 1985, P. 10E297.--

Abstract, line 5, "octapole" should be --octupole--.

Col. 4, line 42, "s" should be --$\underline{s}$--.

Col. 5, line 39, "Which" should be --which--.

Col. 5, line 67, "$U_i$." should be --$U_i$,--.

Signed and Sealed this

Eighth Day of May, 1990

Attest:

HARRY F. MANBECK, JR.

Attesting Officer

Commissioner of Patents and Trademarks